United States Patent [19]

Bonelli et al.

[11] Patent Number: 5,055,777
[45] Date of Patent: Oct. 8, 1991

[54] APPARATUS FOR TESTING OF INTEGRATED CIRCUITS

[75] Inventors: Riccardo Bonelli, Hamburg; Gunter Plohn, Bad Schwartau, both of Fed. Rep. of Germany

[73] Assignee: Minnesota Mining and Manufacturing Company, St. Paul, Minn.

[21] Appl. No.: 472,896

[22] Filed: Jan. 31, 1990

[30] Foreign Application Priority Data

Feb. 2, 1989 [DE] Fed. Rep. of Germany ....... 3903060

[51] Int. Cl.$^5$ ...................... G01R 31/02; G01R 15/12
[52] U.S. Cl. ............................. 324/158 F; 324/156 P; 324/72.5
[58] Field of Search ............... 324/158 F, 158 P, 72.5, 324/500; 439/482

[56] References Cited

U.S. PATENT DOCUMENTS 4,318,042 3/1982 Eda et al. .....................: 324/72.5
4,897,598 1/1990 Doemens et al. ............... 324/158 F

FOREIGN PATENT DOCUMENTS

3343274C2 9/1988 Fed. Rep. of Germany .

OTHER PUBLICATIONS

Garparri et al., "Bucking Beam Probe"; IBM Technical Disclosure Bulletin; vol. 16, No. 5, Oct. 1973 (324/158P).

Primary Examiner—Kenneth Wieder
Assistant Examiner—Vinh P. Nguyen
Attorney, Agent, or Firm—Gary L. Griswold; Walter N. Kirn; John C. Barnes

[57] ABSTRACT

An apparatus for testing of integrated circuits (ICs) has parallel plates arranged at a fixed distance from each other, each having a plurality of aligning bores, and a plurality of equally oriented contact elements made of resilient sheet material. The elements have a first straight end portion sitting in a bore of one of said plates and a second straight end portion sitting in an aligning bore of the other of said plates. A pressure member is used to move an IC toward the outer side of one of the plates and the first end portions of the contact elements, which first ends extend slightly beyond the outer side of one of the plates and form a pattern which corresponds to the pattern of contact points of the IC to be tested. The second end portions of the contact elements are adapted to be connected to a testing device, and the portion of the contact elements between said first and second end portions lie between the plates and are offset relative to the end portions and experience multiple deflections as axial pressure is exerted on the first end portions. The contact elements are formed out of a flat strip, and the center portion of each element is bent out of the plane defined by the strip.

12 Claims, 2 Drawing Sheets

APPARATUS FOR TESTING OF INTEGRATED CIRCUITS

BACKGROUND OF THE INVENTION

1. Field of the Invention

The invention refers to an apparatus for testing integrated circuits according to the preamble of patent claim 1.

2. Description of Prior Art

The conducting paths or contact points of integrated circuits (IC) are arranged with a predetermined pitch. In case of highly integrated ICs a progressively smaller pitch is applied. In the manufacturing of ICs it is necessary to test the accuracy and function after fabrication. For this, test apparatuses have been developed by which a temporary connection with all leads or contacts can be established in order to test the geometrical position of contact points and the function of the integrated elements, respectively.

It is also known in connection with such test apparatuses to arrange two parallel plates at a distance from each other which have a pattern of aligned bores. End portions of resilient contact elements are sitting in the bores. An IC to be tested is received on the outer side of a plate in a predetermined positional relation in order to bring the pattern of end portions of the contact elements in engagement with the pattern of contact points of the IC. By means of a pressure member the IC chip is pressed against the contact elements which form springs. In the known testing apparatus the contact elements are cut out of sheet material and have coaxial end portions and a center portion which is arcuately curved in the plane of the sheet material strip. The end portion of the contact elements facing the pressure member extends slightly beyond the outer side of the plate. If upon engagement of the contact points of the IC with the contact elements of the test apparatus an axial pressure is exerted on the contact elements, the center portion of the contact elements between the plates is deformed, contemporaneously a pressure electrical contact is generated between the contact elements and the contact points of the chip. The The areal moment of inertia of the known contact elements in bending direction is relatively high so that they have to have a deep arc or slope in the center portion to secure that the spring force does not exceed a predetermined value. It is not possible to reduce the spring force in that the material has a smaller thickness. To achieve a controlled bending, the sheet material from which the contact elements are cut out has to have a thickness of at least 0.25 to 0.4 mm. The explained shape of the contact elements means that, upon arrangement in a line one after the other, the distance of the contact points from each other cannot be below a minimum value. This minimum distance is so large that in case of IC chips having a small pitch the known contact elements cannot be used. A narrower distance between the contact points of the IC chips can be tested with the known apparatus only if the contact points are located offset, e.g. in a staggered formation rather than in form of a chess board pattern. It is understood that such an arrangement does not allow a high packing density as a chess board distribution.

The object of the invention is to provide an apparatus for testing of IC chips which allows a satisfactory testing also with very low pitched chips.

This object is attained by the features of the characterizing portion of patent claim 1.

SUMMARY OF THE INVENTION

In the apparatus according to the invention, the contact elements are formed out of flat strips which preferably are cut out of sheet material. The center portion of the flat strip is bent out of the plane of the strip. The manufacturing of such contact element requires a further strip if compared with the known contact elements, however, by the invention they can be brought into a shape which enables a more tight arrangement and thus a smaller pitch. The shape of the contact element according to the invention results in that the bending force on the center portion does not effect in the plane of the sheet material, rather approximately perpendicularly thereto. The center portion of the contact elements can be shaped such that the flexing or bending is distributed about a larger portion so that the maximum deflection is relatively small.

Therefore, the contact elements can have relatively small dimensions in the plane of their deflection and can be tightly arranged one after the other. By means of the contact elements according to the invention a small pitch is achieved corresponding to a small pitch of an IC chip.

Preferably, according to an embodiment of the invention, the center portion of the contact elements is formed such that with contact elements arranged in rows and columns the center portions are partially nested at least during their deflection. By this, a high packing density of the contact elements in a direction transverse to the plane of the sheet material can be achieved. The packing density transverse thereto is determined by the width of the contact elements as well as by the minimum distance which the contact elements have to have in order to safely avoid any contact between them.

According to an embodiment of the invention, the center portion consists of a plurality of sections including an angle relative to each other, the sections joining by an arc having a relatively small radius. By this, all sections contribute to a flexure of the contact elements upon an axial pressure on an end portion of the contact element whereby only a relatively small lateral deflection occurs. Preferably, three sections are provided, the center section extending at a distance and parallel to the axis through the first and second end portions while the other sections are inclined to the center section or to the first and second end portion, respectively. In such an embodiment, the center section is loaded with a uniform bending moment if during the testing process the aligned end portions approach each other under contemporary deflection of the oblique sections. The center section is significantly longer than the other sections, preferably has twice the length. Such a shape of the contact element enables a tight nesting of the contact elements without the danger that they touch each other upon deflection.

In order to achieve a specific spring behavior it could be thought to change the width of the contact element through its length. However, it turned out that such a measure which by the way would lead to a more expensive fabrication is not necessary, rather, according to a further embodiment of the invention, the center portion of the contact elements could have an equal width over its length.

According to a further embodiment of the invention, a weakening of material is provided between the first and/or the second end portion and the center portion. The weakening operates like a hinge upon deformation of the contact element so that a directed bending force is applied to the center portion which results in a significant flexure of the center portion with a preferably uniform bending moment over the larger extent of its length.

In order to arrange the contact elements between the plates in a predetermined orientation the junctions between the central portion and the end portions have an enlargement which serves as an abutment and engages the associated plate surface. According to a further embodiment of the invention, one or both enlargements may engage a correspondingly formed slot in the plates. By this, the orientation of the contact element is fixed and it is prevented from rotation.

The second end portions of the contact elements are to be connected with a testing device. In order to restrict the contact elements from being deformed by engagement of the second end portion, according to a further embodiment of the invention, the second end portions are fixedly secured in the bores, preferably by an adhesive.

DESCRIPTION OF THE DRAWINGS

The invention is explained in more detail with the aid of drawings.

DETAILED DESCRIPTION OF THE INVENTION

Figure 1:
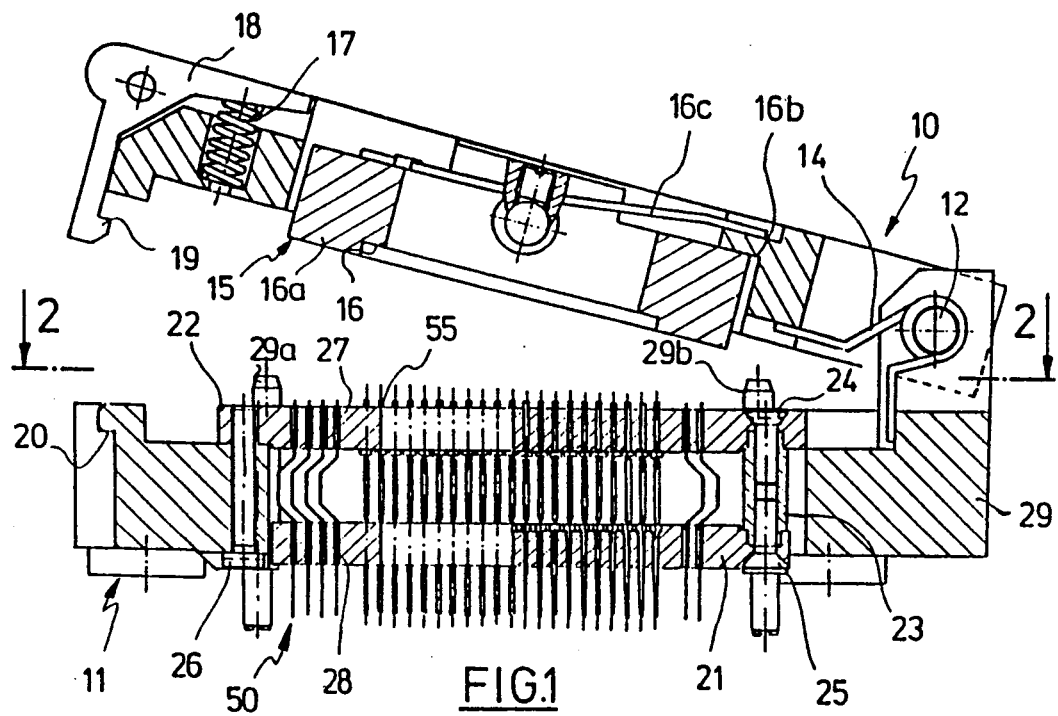
FIG. 1 is a cross section through an apparatus according to the invention along line 1—1 of the illustration in FIG. 2.
Figure 2:
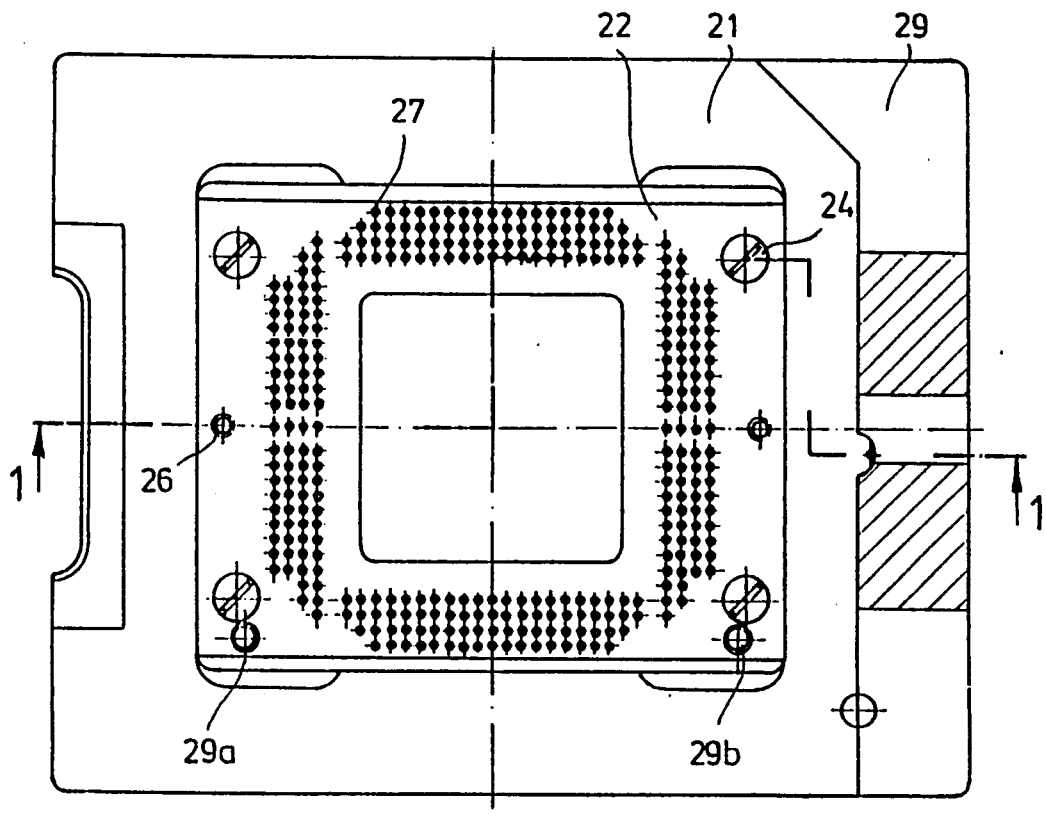
FIG. 2 is a plan view on the lower part of the apparatus of FIG. 1 looking in direction of line 2—2 of FIG. 1.

The testing apparatus shown in FIGS. 1 and 2 includes an upper cover 10 and a socket 11 joined by a hinge 12. A helical spring 14 urges both parts 10, 11 away from each other. Part 10 includes a replaceable pressure part 15 which has a recess 16 and a surrounding rectangular margin 16a. The insert 15 at one end is supported by the cover 10 shown at 16b and is suspended by a spring 16c. The cover 10 has a pawl 18 biased by a spring 17, the pawl having a nose 19. The nose 19 undergrips a shoulder 20 of the socket 11 if the cover 10 is pivoted against socket 11.

The socket 11 is comprised of a lower plate 21 and an upper plate 11 which are interconnected by a threaded fastener. In FIG. 1, a sleeve-like spacer 23 can be seen between plates 21, 22, screws 24, 25 are threaded into the spacer through bores in plates 21, 22. Several of such threaded connections including a spacer 23 assure that the plates 21, 22 are arranged at a predetermined axial distance from each other. The plate arrangement is mounted within a rectangular recess of a frame 29 and is fastened to the frame by threaded pins as illustrated in FIG. 2, left hand side at 26. The upper plate 22 includes two retaining or positioning pins 29a, 29b which cooperate with corresponding holes of the chip sheet of the IC.

The plates 21, 22 have bores 27, 28 which are axially aligned and arranged in a predetermined pattern. This pattern can be seen in FIG. 2. The bores are arranged in rows and columns like a chess board with tight packing, e.g. with a distance between their axes of about 1 mm. The pattern of the bores corresponds to the pattern and the pitch of the contact points of the chips to be tested.

Figure 3:
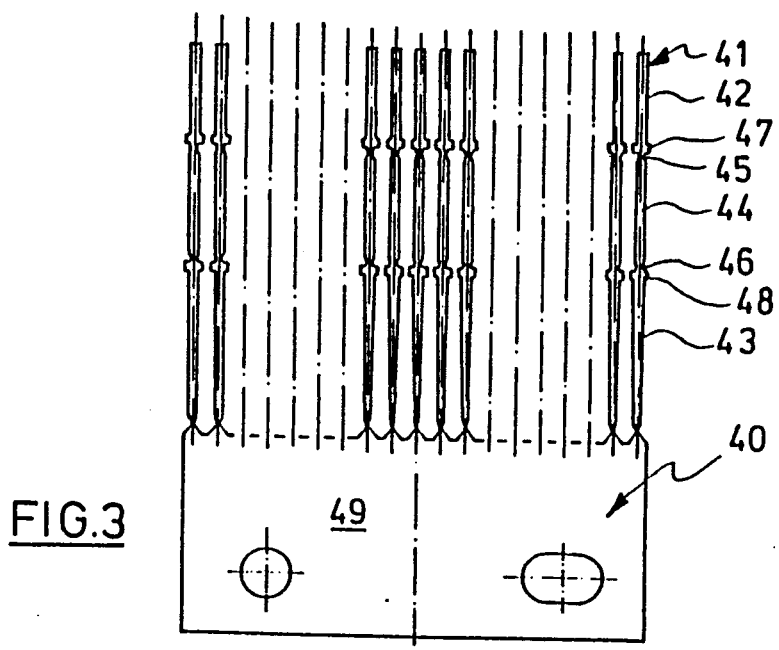
FIG. 3 shows a plan view on an arrangement of preforms for contact elements of the apparatus according to FIGS. 1 and 2 after having been cut out of a sheet blank.
Figures 4, 5:
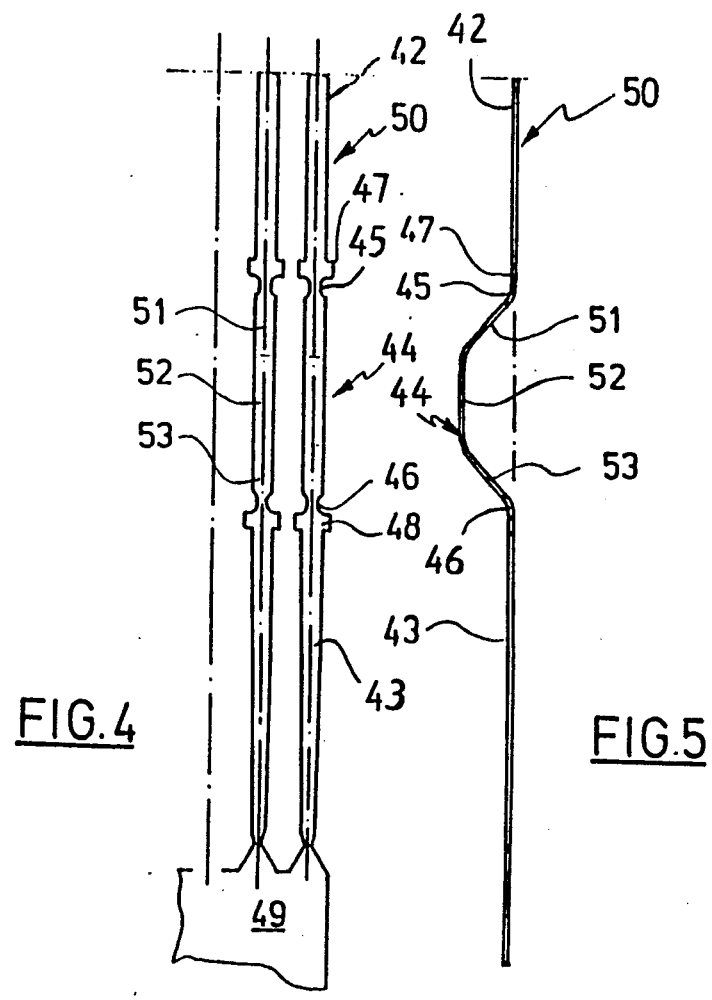
FIG. 4 shows in a larger scale two contact elements in elevational view.
FIG. 5 shows a side view of a contact element formed for insertion in the test apparatus.

The bores 27, 28 receive contact elements 30, the structure thereof will be explained in detail with the aid of FIGS. 3, 4, and 5.

Flat strips 41 are cut out of a blank 40 of sheet material, preferably metal sheet, the strips consisting of end portions 42, 43 and a center portion 44. A constriction 45 or 46, respectively, is provided at the transition between the center portion 44 and the end portions 42, 43. An enlargement 47 or 48, respectively, is provided at the inward end of end portions 42, 43. Except the constrictions 45, 46 and the enlargements 47, 48, the width of the strips is for example 0.5 mm. The end portion 43 is narrower and tapers to its free end.

Upon cutting out of the sheet blank, the strips 41 remain joined to a section 49 allowing that the strips can be deformed commonly. The deformation can be seen in FIG. 5. The deformed strips define contact elements 50 which bear the same reference numbers as the strips 41 in FIG. 3. It can be seen that only the center portion 44 is deformed. The center portion 44 is bent out of a plane defined by the end portions 42, 43 whereby three straight sections 51, 52, 53 are generated which are interconnected through arcs having a relatively small radius, e.g. 0.5 mm. The center section 52, the length of which being nearly the double of the length of the outer sections 51 and 53, extends parallel and spaced or offset from the plane defined by the end portions 42, 43. The other sections 51, 53 extend at an angle with respect to the end portions 42, 43 or the center section 44 of for example 50°.

The contact elements 50 are located in the socket 11 such that the first or upper end portions 42 are within the bores 27 of upper plate 22 while the lower end portions 43 are in the aligned bores 28 of the lower plate 21. The enlargements 47 engage the lower side of plate 22 while the enlargements 48 engage slots of the lower plate 21 whereby the contact elements 50 are secured against rotation. The end portions 43, extending beyond the lower plate 21, are adapted to be connected with corresponding terminals of a testing device or printed circuit board. The upper or first end portions 42 extend slightly beyond the upper side of plate 22 as can be seen in FIG. 1 at 55. The salient length is for example 0.5 mm.

For testing purposes, the IC chip is held in its testing position on the upper plate by means of pins 29a, 29b. Thereafter, the cover 10 is pivoted towards socket 11 until nose 19 undergrips shoulder 20. By this, the contact points of the IC chip are pressed against the protruding ends 55 and urge them toward their bores 27. A vertical force is exerted on the center portion 44 of the contact elements 50 which results in a deflection both of the sections 51, 53 and the center section 52. The center section 52 is loaded approximately with an equal bending moment.

As can be seen in FIG. 1, the particular shape of the center portion 44 of the contact elements 50 allows a nesting of the contact elements 50 if serially arranged parallel to each other, whereby a tight arrangement and a very fine pitch can be achieved.

We claim:

1. An apparatus for testing of integrated circuits (ICs), comprising parallel plates arranged at a fixed distance from each other and including a plurality of aligning bores, comprising further a plurality of equally oriented contact elements made of resilient sheet material, a first straight end portion of said contact elements sitting in a bore of one of said plates and a second straight end portion sitting in an aligning bore of the other of said plates, pressure member means for an IC positioned in relationship to said plates for moving said IC toward the outer side of one of said plates in a predetermined positional relation to contact the contact elements, said first end portions of said contact elements facing said pressure member means and extending slightly beyond said outer side of said one of said plates and forming a pattern which corresponds to the pattern of contact points of the IC to be tested, while said second end portions of said contact elements are adapted to be connected to a testing device, and the portion of said contact elements between said first and second end portions, lying between said plates, being offset relative to said end portions and experiencing a deflection if an axial pressure is exerted on said first end portion, said contact element being formed out of a flat strip which is bent at four points to place a center portion offset from the plane defined by said end portions of said strip.

2. The apparatus according to claim 1, wherein said center portion is formed such that in a row of said contact elements parallel to each other said center portions are nested partially at least during their deflection.

3. The apparatus according to claim 1 or 2 wherein said center portion is comprised of a plurality angularly arranged sections.

4. The apparatus according to claim 3, wherein said sections are straight and interconnected through an arc of a relatively small radius.

5. The apparatus according to claim 1, wherein said center portion comprises three sections, one said center section extending parallel to and spaced from said first and said second end portions, while said other center sections extend obliquely to said one center section or said first and said second end portion, respectively.

6. The apparatus according to claim 5, wherein said one center section is longer than said other sections, preferably double the length.

7. The apparatus according to claim 1, wherein said center portion of said contact elements have approximately an equal width through its length.

8. The apparatus according to claim 1, wherein the junction between said center portion and first and said second end portion includes an area of weakening.

9. The apparatus according to claim 8, wherein the junction between said center portion and one end portion of said contact element includes an enlargement engaging the associated side of one of said plates.

10. The apparatus according to claim 9, wherein one said enlargement engages a slot formed in the associated plate.

11. The apparatus according to claim 8, wherein the junction between the center portion and said end portions of said contact elements include enlargements in the flat strip adapted for engaging the opposed sides of the plates.

12. The apparatus according to claim 11, wherein said second end portions are electrically connected to said testing device and are axially fixed in the associated bore in said other of said plates, preferably by an adhesive.

* * * * *